(12) United States Patent
Güte (10) Patent No.: US 9,525,416 B2
(45) Date of Patent: Dec. 20, 2016

(54) MULTIFUNCTIONAL TOUCH AND/OR PROXIMITY SENSOR

(75) Inventor: Andreas Güte, Hong Kong (HK)

(73) Assignee: MICROCHIP TECHNOLOGY GERMANY GMBH, Gilching (DE)

( * ) Notice: Subject to any disclaimer, the term of this patent is extended or adjusted under 35 U.S.C. 154(b) by 940 days.

(21) Appl. No.: 13/512,935

(22) PCT Filed: Dec. 3, 2010

(86) PCT No.: PCT/EP2010/068884
§ 371 (c)(1),
(2), (4) Date: Nov. 5, 2012

(87) PCT Pub. No.: WO2011/069925
PCT Pub. Date: Jun. 16, 2011

(65) Prior Publication Data
US 2013/0050139 A1     Feb. 28, 2013

(30) Foreign Application Priority Data
Dec. 11, 2009 (DE) .......................... 10 2009 057 947

(51) Int. Cl.
| H03K 17/955 | (2006.01) |
| G06F 1/16 | (2006.01) |
| H03K 17/96 | (2006.01) |

(52) U.S. Cl.
CPC .......... *H03K 17/955* (2013.01); *G06F 1/1626* (2013.01); *H03K 17/962* (2013.01);
(Continued)

(58) Field of Classification Search
None
See application file for complete search history.

(56) References Cited

U.S. PATENT DOCUMENTS

| 3,826,979 A | 7/1974 | Steinmann ..................... 361/178 |
| 5,594,222 A | 1/1997 | Caldwell ....................... 200/600 |

(Continued)

FOREIGN PATENT DOCUMENTS

| CN | 1155154 C | 6/2004 | .......... H03K 17/955 |
| CN | 1711550 A | 12/2005 | ............... G06K 9/00 |

(Continued)

OTHER PUBLICATIONS

Japanese Office Action, Application No. 2012-542477, 8 pages, Apr. 6, 2015.

(Continued)

*Primary Examiner* — Quan-Zhen Wang
*Assistant Examiner* — Dong Hui Liang
(74) *Attorney, Agent, or Firm* — Slayden Grubert Beard PLLC (57) ABSTRACT

A sensor device has at least one first sensor element for detecting a touch and/or an approach, which is configured as a capacitive sensor element and which has a first electrode structure with a transmitting electrode and a reception electrode, wherein a first alternating electrical field emitted by the transmitting electrode may be coupled into the reception electrode,—at least one second sensor element, and—an evaluating device, which is coupled with the at least one first sensor element and with the at least one second sensor element, wherein the evaluating device is configured to evaluate a first signal tapped from the reception electrode of the first sensor element and at least one second signal provided by the second sensor element and to generate at least one detection signal dependent on the evaluation.

19 Claims, 5 Drawing Sheets

(52) U.S. Cl.
CPC .............. *H03K 2217/96077* (2013.01); *H03K 2217/960765* (2013.01); *H03K 2217/960775* (2013.01)

(56) References Cited

U.S. PATENT DOCUMENTS

| | | | | |
|---|---|---|---|---|
| 6,292,674 | B1* | 9/2001 | Davis | H04M 1/0281 455/550.1 |
| 6,442,013 | B1* | 8/2002 | Lindgren | H04M 1/0202 340/870.37 |
| 7,088,342 | B2 | 8/2006 | Rekimoto et al. | 345/169 |
| 7,339,381 | B2 | 3/2008 | Van Berkel | 324/452 |
| 7,560,938 | B2 | 7/2009 | Van Berkel et al. | 324/662 |
| 2002/0093481 | A1* | 7/2002 | Kehlstadt | G06F 1/3203 345/156 |
| 2009/0133508 | A1 | 5/2009 | Johansson et al. | 73/862.046 |
| 2011/0025345 | A1* | 2/2011 | Unterreitmayer | G06F 1/3231 324/600 |
| 2012/0026121 | A1* | 2/2012 | Unterreitmayer | G06F 1/1613 345/174 |
| 2014/0118011 | A1* | 5/2014 | Burger | G06F 1/1684 324/676 |

FOREIGN PATENT DOCUMENTS

| | | | |
|---|---|---|---|
| DE | 202008013083 U1 | 1/2009 | ........... H03K 17/955 |
| JP | 2002-522967 A | 7/2002 | .............. H02M 1/00 |
| JP | 2003029899 A | 1/2003 | ............... G06F 3/02 |
| JP | 2003330611 A | 11/2003 | ............... G06F 1/16 |
| JP | 2005317041 A | 11/2005 | ............... G06F 3/00 |
| JP | 2006525635 A | 11/2006 | ............... G06F 1/16 |
| WO | 2009/130165 A2 | 10/2009 | ............. G06F 3/033 |

OTHER PUBLICATIONS

Chinese Office Action, Application No. 201080055949.1, 14 pages, Oct. 10, 2014.
International PCT Search Report, PCT/EP2010/068884, 14 pages, Jun. 30, 2011.
Japanese Office Action, Application No. 2012-542477, 7 pages, Aug. 21, 2014.
European Office Action, Application No. 10790636.4, 6 pages, Apr. 7, 2016.
Chinese Office Action, Application No. 201080055949.1, 4 pages, Dec. 29, 2015.
Korean Office Action, Application No. 1020127017671, 6 pages, Sep. 27, 2016.

* cited by examiner

MULTIFUNCTIONAL TOUCH AND/OR PROXIMITY SENSOR

CROSS-REFERENCE TO RELATED APPLICATIONS

This application is a U.S. National Stage Application of International Application No. PCT/EP2010/068884 filed Dec. 3, 2010, which designates the United States of America, and claims priority to German Application No. 10 2009 057 947.8 filed Dec. 11, 2009, the contents of which are hereby incorporated by reference in their entirety.

TECHNICAL FIELD

The various embodiments of the present disclosure relate to a sensor device and a method for providing a detection signal. The detection signal may be used for controlling a device state of an electric device.

BACKGROUND

From prior art sensor devices are known, which may be arranged for example on a hand-held device, in order to detect quantitatively measurement parameters. For example it is known to provide infrared sensors in a mobile phone in the area of the loudspeaker, with which the distance to an object may be detected. So for example it may be detected how far is the mobile phone to an ear. Depending on the distance, the display of the mobile phone may be then switched on or off.

It is disadvantageous in this respect, that the infrared sensors are visible from the outside, because at least the probe must be arranged at the surface of the mobile phone. Thus the possibilities of the design of the mobile phone are limited. Moreover, it cannot be reliably detected, if the mobile phone lies in fact at the ear or if the infrared sensor or the probe is not covered by e.g. a hand.

SUMMARY

According to various embodiments, a sensor device can be provided, which avoids at least partially the disadvantages known from prior art.

According to an embodiment, a sensor device may comprise at least one first sensor element for the detection of a touch and/or an approach, which is configured as a capacitive sensor element and which comprises a first electrode structure, comprising a transmitting electrode and a reception electrode, wherein a first alternating electrical field emitted by the transmitting electrode is coupleable into the reception electrode, at least one second sensor element, and an evaluating device, which is coupled with the at least one first sensor element and with the at least one second sensor element, wherein the evaluating device is configured to evaluate a first signal tapped from the reception electrode of the first sensor element and at least one second signal provided by the second sensor element and to generate at least one detection signal dependent on the evaluation.

According to a further embodiment, the first electrode structure may comprise a compensation electrode, wherein the evaluating device comprises a signal generator for supplying the transmitting electrode with a first alternating electrical signal and for supplying the compensation electrode with a second alternating electrical signal, wherein a second alternating electrical field emitted by the compensation electrode is coupleable into the reception electrode. According to a further embodiment, the compensation electrode can be arranged substantially between the transmitting electrode and the reception electrode. According to a further embodiment, the second alternating electrical signal can be dephased to the first alternating electrical signal. According to a further embodiment, the first sensor element may comprise a second electrode structure, wherein the second electrode structure comprises a number of field sensing electrodes, wherein the reception electrode, the transmitting electrode, the compensation electrode and the field sensing electrodes are arranged with respect to one another in such a way that the first alternating electric field emitted by the transmitting electrode is also coupleable into at least one of the field sensing electrodes, and the second alternating electric field emitted by the compensation electrode is coupleable substantially only into the reception electrode, wherein the evaluating device is configured to evaluate a third signal tapped from at least one of the field sensing electrodes. According to a further embodiment, the amplitude of the first alternating electrical signal can be greater than an amplitude of a second alternating electrical signal. According to a further embodiment, an approach of an object to the first electrode structure may lead to a change in a level of the first signal tapped from the reception electrode, which is indicative for the approach of the object to the first electrode structure. According to a further embodiment, an additional approach of the object to the second electrode structure may lead to a change in a level of the at least one third signal tapped from the field sensing electrodes, wherein the level change of the third signal indicates that the object is approaching both the first electrode structure and the second electrode structure. According to a further embodiment, at least one auxiliary electrode can be assigned to one of the field sensing electrodes, wherein the auxiliary electrode is coupleable galvanically or capacitively with the at least one field sensing electrode. According to a further embodiment, the third signals tapped from the field sensing electrodes can be evaluated by a time-division multiplexing method. According to a further embodiment, the second sensor element may comprise at least one of position sensor, acceleration sensor, photosensor, and temperature sensor. According to a further embodiment, the sensor device can be configured to be arranged in an electric hand-held device.

According to another embodiment, a method for providing a detection signal, wherein a first signal is tapped from a reception electrode of a first sensor element, wherein the first sensor element is configured as a capacitive sensor element and comprises a first electrode structure, which comprises a transmitting electrode and the reception electrode, wherein a first alternating electrical field emitted by the transmitting electrode is coupled into the reception electrode, the first signal is evaluated, a second signal is evaluated, which is provided by a second sensor element, and a detection signal is generated, which depends on the evaluated first signal and on the evaluated second signal.

According to a further embodiment of the above method, the first sensor element may comprises a second electrode structure, which comprises a number of field sensing electrodes, wherein the first alternating electric field emitted by the transmitting electrode is coupled into at least one field sensing electrode, a third signal is tapped from at least one field sensing electrode, and the third signal is evaluated, wherein the detection signal depends on the evaluated third signal. According to a further embodiment of the method, from the field sensing electrodes the third signal is tapped in a time-division multiplexing method. According to a further embodiment of the method the first electrode structure may comprise a compensation electrode and wherein the transmitting electrode is supplied with a first alternating electrical signal and the compensation electrode is supplied with a second alternating electrical signal. According to a further embodiment of the method an auxiliary electrode can be assigned to at least one of the field sensing electrodes, which is galvanically or capacitively coupleable with the field sensing electrodes. According to a further embodiment of the method the detection signal can be indicative for the approach of a body to the first electrode structure and wherein in case of an approach of the body to the first electrode structure, which is arranged in an electric hand-held device, the electric hand-held device is switched from a first operating mode into a second operating mode. According to a further embodiment of the method the first operating mode can be a sleeping mode and wherein the second operating mode is an active mode.

According to yet another embodiment, an electric hand-held device may comprise a sensor device comprising at least one first sensor element for the detection of a touch and/or an approach, which is configured as a capacitive sensor element and which comprises a first electrode structure, comprising a transmitting electrode and a reception electrode, wherein a first alternating electrical field emitted by the transmitting electrode is coupleable into the reception electrode, at least one second sensor element, and an evaluating device, which is coupled with the at least one first sensor element and with the at least one second sensor element, wherein the evaluating device is configured to evaluate a first signal tapped from the reception electrode of the first sensor element and at least one second signal provided by the second sensor element and to generate at least one detection signal dependent on the evaluation.

According to a further embodiment of the electric hand-held device, the electrodes of the first electrode structure can be arranged in the hand-held device in such a way that, in case of an encompassing of the hand-held device by a hand, these are at least partially covered by the hand. According to a further embodiment of the electric hand-held device, the electric hand-held device may comprise at least one of mobile phone, input means for game console, mobile mini-computer, headphone, computer mouse, and remote control.

Therefore, a sensor device is provided, which comprises:
  at least one first sensor element for detecting a touch and/or an approach, which is configured as a capacitive sensor element and which comprises a first electrode structure, comprising a transmitting electrode and a reception electrode, wherein a first alternating electric field emitted by the transmitting electrode may be coupled into the reception electrode,
  at least one second sensor element, and
  an evaluating device, which is coupled with the at least one first sensor element and with the at least one second sensor element, wherein the evaluating device is configured to evaluate a first signal tapped from the reception electrode of the first sensor element and at least one second signal provided by the second sensor element and to generate at least one detection signal depending on the evaluation.

In this way e.g. an operating mode of an electric device may be changed, which is not only depending on the touch of the device and/or on the proximity to the device, but is also depending on other sensor values. Advantageously, the ergonomics, particularly of electronic hand devices, may be clearly improved.

The first electrode structure may comprise a compensation electrode, wherein the evaluating device comprises a signal transmitter for supplying the transmitting electrode with a first alternating electrical signal and for supplying the compensation electrode with a second alternating electrical signal, and wherein a second alternating electric field emitted by the compensation electrode may be coupled into the reception electrode.

Thus, by an appropriate arrangement of the transmitting electrode, the reception electrode and the compensation electrode on a hand-held device, the detection of an encompassing of the hand-held device by a hand may be realized in a particularly advantageous way.

The compensation electrode may be arranged substantially between the transmitting electrode and the reception electrode.

The second alternating electrical signal may be dephased to the first alternating electrical signal.

The first sensor element may comprise a second electrode structure, comprising a number of field sensing electrodes, wherein the reception electrode, the transmitting electrode, the compensation electrode and the field sensing electrodes are arranged with respect to each other in such a way, that
  the first alternating electric field emitted by the transmitting electrode may also be coupled into at least one of the field sensing electrodes, and
  the second alternating electric field emitted by the compensation electrode may be coupled substantially only into the reception electrode,
wherein the evaluating device is configured to evaluate a third signal tapped from at least one of the field sensing electrodes.

With the field sensing electrodes the observation area of the capacitive sensor element at a hand-held device may be clearly enlarged, wherein at the same time it is also guaranteed that an approach to only the field sensing electrodes does not lead to a detection, because a detection of an approach to the field sensing electrodes is only reached when the alternating field emitted at the transmitting electrode is coupled into the field sensing electrodes over the hand, which corresponds to an enlarged capacitive coupling between transmitting electrode and field sensing electrodes.

The amplitude of the first alternating electrical signal may be greater than the amplitude of the second alternating electrical signal.

An approach of an object to the first electrode structure may lead to a change in a level of the first signal tapped from the reception electrode, which is indicative for an approach of an object to the first electrode structure.

An additional approach to the second electrode structure of the object may lead to a change in a level of the of at least one third signal tapped from the field sensing electrodes, wherein the level change of the third signal indicates that the object approaches to both the first electrode structure and the second electrode structure.

An auxiliary electrode may be assigned to at least one of the field sensing electrodes, wherein the auxiliary electrode may be galvanically or capacitively coupled with the at least one field sensing electrode.

The second sensor element may comprise at least one of position sensor, acceleration sensor, photosensor, and temperature sensor.

The various embodiments also provides a method for providing a detection signal, wherein
  a first signal is tapped from a reception electrode of a first sensor element, wherein the first sensor element is configured as a capacitive sensor element and comprises a first electrode structure comprising a transmitting electrode and the reception electrode, wherein a first alternating electric field emitted by the transmitting electrode is coupled into the reception electrode, the first signal is evaluated, a second signal is evaluated, which is provided from a second sensor element, and a detection signal is generated, which depends on the evaluated first signal and on the evaluated second signal.

The first sensor element may comprise a second electrode structure comprising a number of field sensing electrodes, wherein the first alternating electric field emitted by the transmitting electrode is coupled into at least one field sensing electrode, at least one field sensing electrode a third signal is detected, and the third signal is evaluated, wherein the detection signal depends on the evaluated third signal.

The first electrode structure comprises a compensation electrode, wherein the transmitting electrode is supplied with a first alternating electrical signal and the compensation electrode is supplied with a second alternating electrical signal.

The second alternating electrical signal may be dephased to the first alternating electrical signal.

The reception electrode, the transmitting electrode, the compensation electrode and the field sensing electrodes are arranged with respect to one another in such a way that a second alternating electric field emitted by the compensation electrode is coupled substantially only into the reception electrode.

Also a method for controlling an device state of an electric device is provided, wherein from a detection signal, which is provided by the method for providing a detection signal, control information is derived, which is used for controlling the device state.

The control information may include e.g.:
the spatial situation of the device,
the conditions of illumination in the environment of the device, or
the temperature in the environment of the device or the temperature inside the unit.

Moreover, an electric hand-held device can be provided, which comprises a sensor device according to various embodiments.

The electrodes of the first electrode structure may be arranged on the hand-held device in such a way that in case of an encompassing of the hand-held device by a hand these are at least partially covered by the hand.

The electric hand-held device may include at least of mobile phone, input means for games console, portable minicomputer, headphone, computer mouse, and remote control.

BRIEF DESCRIPTION OF THE DRAWINGS

Further details and characteristics of various embodiments result from the following description in association with the drawing. The figures show.

DETAILED DESCRIPTION

The mode of operation of the capacitive sensor element according to various embodiments will be now explained in more detail.

Figure 1:
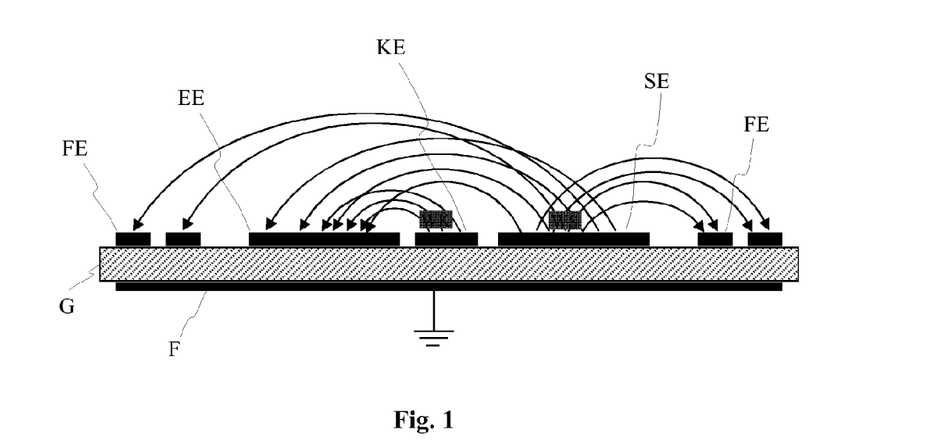
FIG. 1 an electrode arrangement of a capacitive sensor element.

FIG. 1 shows an example of the arrangement of the electrodes of a sensor device according to various embodiments on the surface of a casing G, for example of a hand-held device. The electrodes arranged on the surface G are formed by two electrode structures.

The first electrode structure comprises one transmitting electrode SE, one compensation electrode KE and one reception electrode EE. In the embodiment shown in FIG. 1 the compensation electrode KE is arranged substantially between the transmitting electrode SE and the reception electrode EE.

The second electrode structure comprises four field sensing electrodes FE. The field sensing electrodes FE are arranged so relative to the first electrode structure, that an alternating electric field WK emitted by the compensation electrode KE is coupled substantially only into the reception electrode EE, but not into the field sensing electrodes FE.

The reception electrode EE of the first electrode structure is connected to a signal input of an evaluating device or a control means. The transmitting electrode SE and the compensation electrode KE of the first electrode structure are each supplied with an alternating electric quantity of a determined frequency and amplitude. This alternating electric quantity is denoted in the following as alternating signal or alternating electrical signal.

The alternating electrical signal supplied to the transmission electrode SE has a frequency of approximately between 50 kHz and 300 kHz. Preferably, the alternating electrical signal supplied to the transmitting electrode SE has a frequency of between 75 kHz and 150 kHz.

The alternating electrical signal supplied to the compensation electrode KE preferably shows the waveform and the frequency of the alternating electrical signal, with which the transmitting electrode SE is supplied. The alternating electrical signal, with which the compensation electrode KE is supplied, is dephased to the alternating electrical signal of the transmitting electrode SE. The phase shift may be done for example with a phase shifter, which is arranged between a signal generator and the transmitting electrode or the compensation electrode (see FIG. 3).

The transmitting electrode SE or the alternating electrical signal supplied to this is so configured, that the alternating electric field WS emitted by the transmitting electrode SE may be coupled into the reception electrode EE. The compensation electrode KE or the alternating electrical signal supplied to this is so configured, that the alternating electric field WK emitted at the compensation electrode KE may be also coupled into the reception electrode EE. By the alternating electric field WK emitted at the compensation electrode KE, which is dephased to the electric alternating field WS emitted by the transmission electrode SE, the level of the alternating electric field acting at the reception electrode EE, which results from the electric alternating fields WS and WK, is reduced or erased by a phase superposition, i.e. by a phase shift of 180° (almost).

The alternating electric fields WK and WS coupled at the reception electrode EE cause that a current flows in the reception electrode EE, which may be supervised or evaluated by the evaluation electronics. This current is indicative for the approach, for example of a hand, to the first electrode structure or for the touch of the first electrode structure by a hand. In the absence of a hand, i.e. when no hands are approaching to the first electrode structure or when the first electrode structure is not touched by a hand, the current flowing through the reception electrode EE presents a level, which lies below a predetermined switching level. Only by a sufficient approach of an object, for example of a hand, to the first electrode structure, the current flowing through the reception electrode EE exceeds the predetermined switching level, so that an approach to the first electrode structure is detected.

The transmitting electrode SE, the compensation electrode KE and the reception electrode EE of the first electrode structure may be arranged on a hand-held device in such a way that, instead of an approach to the first electrode structure, a touch of the first electrode structure is detected. Such an electrode arrangement on a hand-held device is described in more detail in regard to FIG. 9.

As already explained, the field sensing electrodes FE of the second electrode structure are arranged with respect to the first electrode structure in such a way that the alternating electric field WK emitted by the compensation electrode KE of the first electrode structure is not coupled into the field sensing electrodes FE of the second electrode structure. In order to ensure this, the alternating electrical signal supplied to the compensation electrode KE may also be set in such a way that the alternating electric field WK emitted at the compensation electrode KE is small enough not to be coupled into the field sensing electrodes FE of the second electrode structure.

In an example of application of the sensor device according to various embodiments, the field sensing electrodes FE of the second electrode structure may be provided in order to detect, at the same time as a contact detected over the first electrode structure of the first electrode structure, also an approach or a touch of the second electrode structure. For this purpose it is sufficient if the field sensing electrodes FE comprises a surface that is smaller than the reception electrode EE of the first electrode structure.

The alternating electric field WS emitted at the transmitting electrode SE of the first electrode structure may couple into the field sensing electrodes FE of the second electrode structure. In the absence of a hand between the first electrode structure in the observation area and the second electrode structure, this capacitative coupling is indeed very small or insignificantly small. The alternating electric field WS coupled at the field sensing electrodes FE causes that an electric current flows through the field sensing electrodes FE, which may be detected and evaluated with an evaluating device. For this electric current flowing through the field sensing electrodes FE a signal level may be also defined, wherein an excess of this signal level indicates an approach of an object to the field sensing electrodes FE.

The sensor device according to various embodiments as well as the electrode arrangement according to various embodiments may be used in a particularly advantageous way to detect, simultaneously to an encompassing of a hand-held device by a hand, also an approach to the hand-held device by a second hand.

Figure 2:
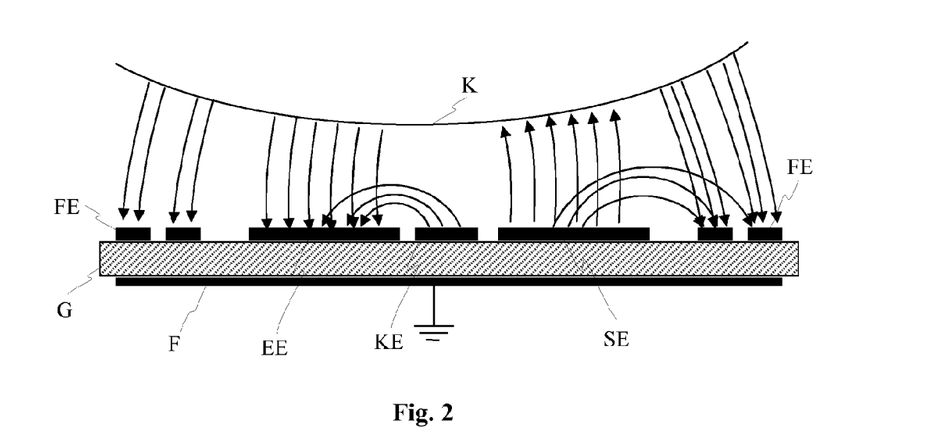
FIG. 2 the electrode arrangement of FIG. 1 as well as the effect of a body approaching to the electrode arrangement on the field lines of the capacitive near field.

FIG. 2 shows the electrode arrangement represented in FIG. 1, in which the field lines among the single electrodes are influenced by a body K. The body K may be for example an approaching hand.

In the case of a hand K approaching the first electrode structure the coupling between the transmission electrode SE and the reception electrode EE is increasingly better, because the alternating electric field WS emitted at the transmitting electrode SE is partially coupled over the approaching hand K into the reception electrode EE and thus withdraws the sphere of action of the alternating electric field WK emitted at the compensation electrode KE. This increasingly better coupling between the transmitting electrode SE and the reception electrode EE causes the level of the current flowing through the reception electrode to be significantly enlarged. As shown in FIG. 2, the approaching hand K acts almost as a bridge for the compensation electrode KE.

The distance between the transmitting electrode on the one hand and the reception electrode or the compensation electrode on the other hand may be selected in such a way that the bridging effect between the transmitting electrode SE and the reception electrode EE may not be produced with a single finger. Such an arrangement is described in more detail in regard to FIG. 9. In a corresponding arrangement of the transmitting electrode relative to the reception electrode on a hand-held device for example the encompassing of the hand-held device may be thus reliably detected.

As shown in FIG. 2, in the case of a body K approaching the electrodes also the coupling between the transmitting electrode SE of the first electrode structure and the field sensing electrode FE of the second electrode structure is increased. From a certain approach of the body K an electric current flows in the field electrodes FE, which exceeds a predetermined level. Exceeding this level may be an indication for the approach of an object, for example of a hand to the field sensing electrodes and to the transmitting electrode SE.

In a corresponding arrangement of the first and the second electrode structure on a hand-held device, the encompassing of the hand-held device by a hand and the approach of an object, for example a second hand, to the hand-held device may be in this way reliably detected. The electrodes of the first electrode structure may be arranged on the hand-held device in such a way that in case of an encompassing by a hand the transmitting electrode SE and the reception electrode EE are at least partially covered. The field sensing electrodes of the second electrode structure may be arranged on the hand-held device in such a way that they are not covered by the hand encompassing the hand-held device. Thus it may be reliably detected if the second hand approaches the hand-held device already encompassed by a hand.

Figure 3:
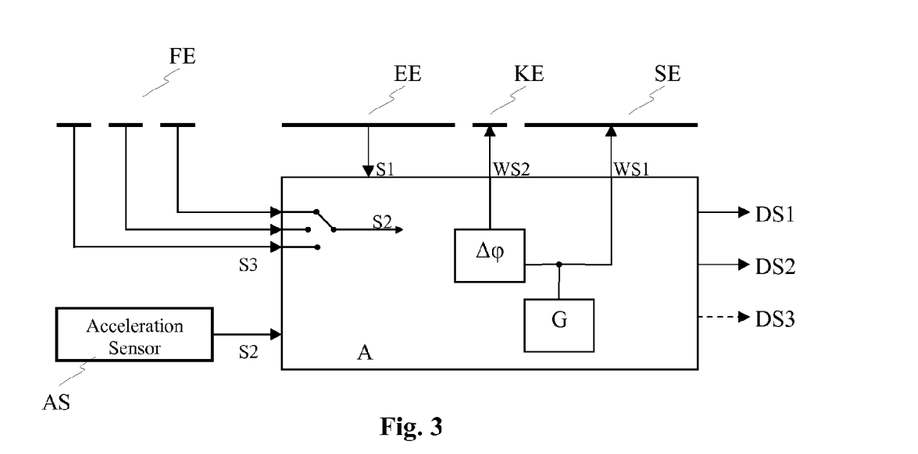
FIG. 3 a block scheme of a possible embodiment of the sensor device according to various embodiments with an acceleration sensor.

FIG. 3 shows a block scheme of a sensor device according to various embodiments. The first electrode structure and the second electrode structure are each coupled with an evaluating device A. The field sensing electrodes FE of the second electrode structure arc coupled with the evaluating device A in such a way as to conduct an electric signal S3 adjacent to the respective field sensing electrodes FE to the evaluating device A.

The reception electrode EE of the first electrode structure is also coupled with the evaluating device A in such a way as to conduct an electric signal S1 detected at the reception electrode EE to the evaluating device.

The compensation electrode KE and the transmitting electrode SE of the first electrode structure are each supplied by the evaluating device A with an alternating electrical signal WS2 or WS1. Preferably the alternating electrical signal WS1 is dephased to the alternating electrical signal WS2. For this purpose the evaluating device may be provided with a signal generator G for producing and providing an alternating electrical signal. The alternating signal provided by the signal generator G may be supplied directly to the transmitting electrode SE. In order to supply the compensation electrode KE with an alternating electrical signal, the signal provided by the signal generator may be conducted through a phase shifter $\Delta\phi$ of the compensation electrode KE.

The evaluating device A is configured to measure and evaluate the electric signal S1 tapped from the reception electrode EE and at least one electric signal S3 tapped from the field sensing electrodes FE. As a result of this evaluation, the evaluating device A may provide a first detection signal DS1 and/or a second detection signal DS2. The detection signals DS1, DS2 provided by the evaluating device A comprises information on whether an object lies in the observation area of the first electrode structure and/or in the observation area of the second electrode structure. The detection signals may be conducted for example to a control device of an electric hand-held device, which depending on the information comprised in the detection signals DS1, DS2 may control the electric hand-held device accordingly.

The information comprised in the detection signals DS1, DS2 may also be provided in a single detection signal.

Preferably, the evaluating device A is configured to measure or evaluate the electric signals S3 tapped from the field sensing electrodes FE separately for each field sensing electrode FE. This has the advantage that a number of field sensing electrodes may be arranged for example on a hand-held device at different places, so that by virtue of the electric signals S3 of the field sensing electrodes FE it may be determined to which field sensing electrode FE a hand or a finger approaches. With an appropriate arrangement of the field sensing electrodes, for example at the upper side of a hand-held device, the outline of an object approaching the field sensing electrodes may be also be determined contactless and with a good precision.

In one embodiment of the sensor device according to various embodiments the electric signals S3 tapped from the field sensing electrodes FE may be evaluated sequentially for example in a time-division multiplex-method, as it is shown for example in FIG. 3.

In addition to the electrodes, the sensor device according to various embodiments may have still further sensors.

For example, an acceleration sensor (AS) may be provided, whose sensor signal S2 is fed to the evaluating device A. The evaluating device A may be configured in such a way that, depending on the electric signals S1 and/or S3, which are tapped from the reception electrode EE or from the field sensing electrodes FE, and the sensor signal S2 provided by the acceleration sensor, it provides a detection signal, which contains for example information on whether a hand-held device is touched and how the handheld device is then oriented. Thus, it may be detected if a mobile phone is encompassed by a hand and approached to the ear, because after an incoming call the mobile phone is not only encompassed by a hand, but because after the encompassing the position of the mobile phone is changed as well. Together with the signals of the field sensing electrodes, a particularly good detecting precision may be reached. An infrared sensor known from prior art is not needed here.

The capacitive sensor according to various embodiments may be provided together with an acceleration sensor and/or a position sensor, in order to detect
- if the device is held at predetermined zones of the device and if the device is vertically oriented (see FIG. 5)—then the device may be switched over into a mode, e.g. a camera mode. At the same time the corresponding contextual menu may be viewed on the display.
- if the device is held at other zones and if the device is horizontally oriented—then the device may be switched over e.g. into a play mode or into an e-Book-Readermode.

Thus, the device state or the mode of operation of a device will be set depending on how the device is touched or taken and depending on how the device is oriented.

Alternatively or additionally, the sensor device according to various embodiments may also comprise a photosensor, whose sensor signals may be evaluated together with the touch or approach. Thus, for example, the following may be realized:

An approach to the device causes the device to change from a sleeping mode into an active mode. At the same time the lighting, for example of the display, may be switched on. In brightly lit environments the lighting is set clearer than in dark environments. But the lighting may also be switched on when the device is also really encompassed. For this purpose no manual inputs on the device by the user are necessary.

Alternatively or additionally, the sensor device according to various embodiments may also be provided with temperature sensors, whose sensor signals may be evaluated together with the touch or the approach. Thus, it may be realized e.g. the following:

An approach to the device causes the device to change from a sleeping mode into an active mode. At the same time the display lighting of an LCD-display may be switched on (the backlight of the LCD-display may depend again on an evaluated signal of the photosensor). If the temperature lies over a predetermined limit value, the contrast of the temperature sensitive LCD-display is readjusted.

In addition to the mentioned sensor signals e.g. also a signal of a timer together with the capacitive sensor may be evaluated. Thus, for example, the following may be realized:

An approach to the device and/or a touch/encompass of the device causes that the device changes from a sleeping mode into an active mode. Depending on the timing pulse, an acoustic signal may be emitted on the device. E.g. before 10 o'clock in the morning a "Guten Morgen" may be emitted, between 12 noon and 6 p.m. a "Guten Tag" may be emitted, and from 6 p.m. a "Guten Abend" may be emitted.

The sensor device according to various embodiments is obviously not limited to the sensors shown here. The sensor device may also include other sensor elements, e.g. a torque sensor, humidity sensors or the like. The various sensors may be provided individually or combined in a sensor device.

Figure 4:
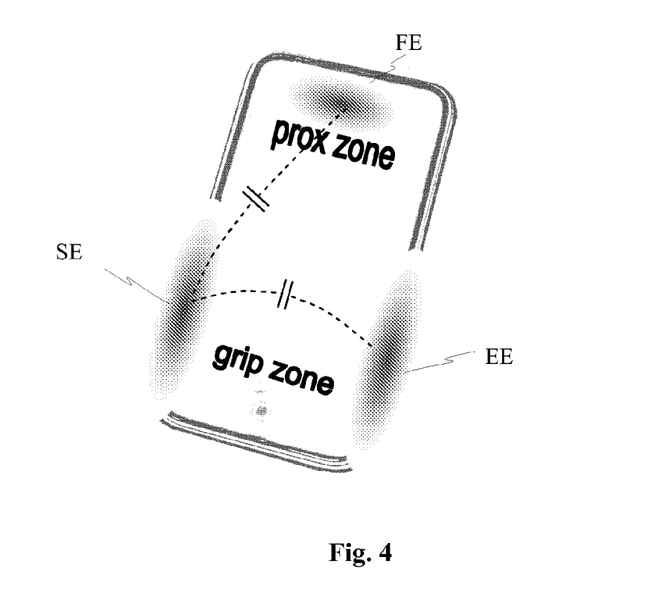
FIG. 4 an arrangement of the electrodes of a sensor device according to various embodiments on an electric hand-held device.

FIG. 4 shows by way of example an arrangement of the electrodes of a sensor device according to various embodiments on an electric hand-held device, for example a mobile phone. In the lower area of the hand-held device in the left edge zone the transmitting electrode SE and in the right edge zone the reception electrode EE and the compensation electrode KE of the first electrode structure are arranged. If the electric hand-held device is encompassed now at the lower area by a hand, the transmitting electrode SE and the reception electrode EE are covered by the hand at least partially. The encompassing of the hand-held device by a hand causes a significant enlargement of the capacitive coupling between the transmitting electrode SE and the reception electrode EE, which has an effect on the current flowing through the reception electrode EE. The functioning has already been described in more detail in regard to FIG. 2.

In the upper area of the electric hand-held device a field sensing electrode FE of the second electrode structure is arranged. The field sensing electrode FE is arranged in such a way that, in case of encompassing of the hand-held device by a hand, the capacitive coupling between the transmitting electrode SE and the field sensing electrode FE is not considerably influenced or is not considerably improved.

If a second hand approaches now the field sensing electrode FE, the capacitive coupling between the transmitting electrode SE and the field sensing electrode FE is also significantly improved, which has again an effect on the current flowing through the field sensing electrode FE.

The lower area of the hand-held device is denoted here as "Grip-Zone", the upper area of the hand-held device is denoted as "Prox-Zone". A possible usage scenario of the electrode arrangement shown in FIG. 4 consists of the fact that, in case of a mobile phone, the encompassing of the mobile phone by a hand and the approach of the mobile phone to an ear of the user may be detected.

The encompassing of the mobile phone is detected with the help of the transmitting electrode SE and the reception electrode EE of the first electrode structure. The approach to an ear is detected by the field sensing electrode FE. By an approach of the mobile phone to the ear the capacitive coupling between the transmitting electrode SE and the field sensing electrode FE over the body of the user is constantly increasing, up to a certain distance of the field sensing electrode FE to the ear that the capacitive coupling becomes so large that the current flowing through the field sensing electrode FE exceeds a predetermined level.

The detection signals provided by the evaluating device A may be then used for example in such a way that in case of an incoming call the ringing signal is set as soon as the mobile phone is encompassed by a hand and that the lighting of the mobile phone display is automatically turned off as soon as the mobile phone is held to the ear.

Figure 5:
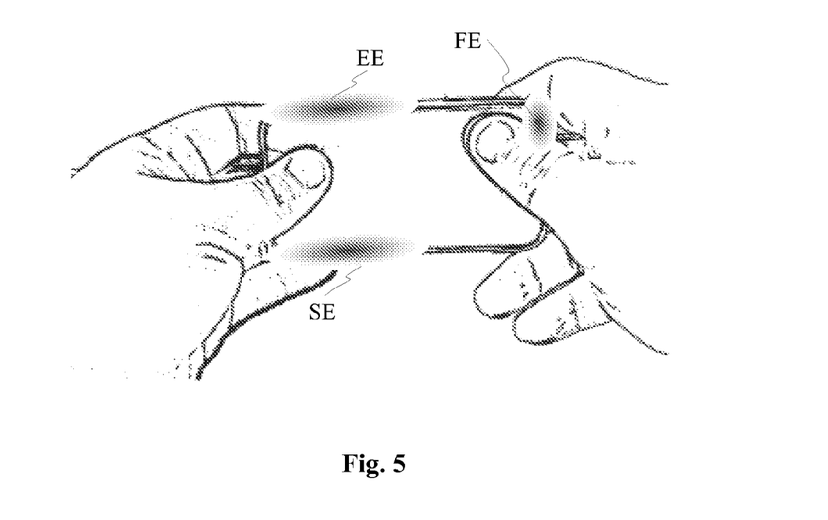
FIG. 5 an application example for an evaluation of several detection signals of a sensor device according to various embodiments in an electric hand-held device.

FIG. 5 shows another usage scenario of a sensor device according to various embodiments in a hand-held device. The electrodes of the first electrode structure and the second electrode structure are arranged here substantially as it is already shown in regard to FIG. 4. In addition to the detection signals provided by the sensor device according to various embodiments, here the position of the mobile phone is evaluated as well. If the mobile phone is touched by a hand at both the lower area and the upper area and the mobile phone is positioned in a substantially horizontal orientation, the mobile phone may be for example switched over automatically into a camera mode. The position of the mobile phone may be determined for example with an acceleration sensor.

Figure 6A:
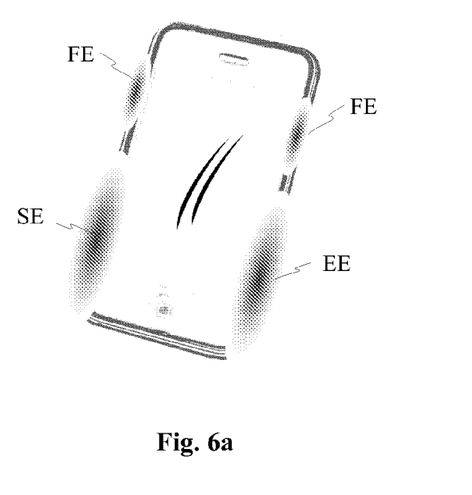
FIG. 6*a*, *b* examples of an arrangement of the electrodes of a sensor device according to various embodiments on an electric hand-held device with two field sensing electrodes or three field sensing electrodes.
Figure 6B:
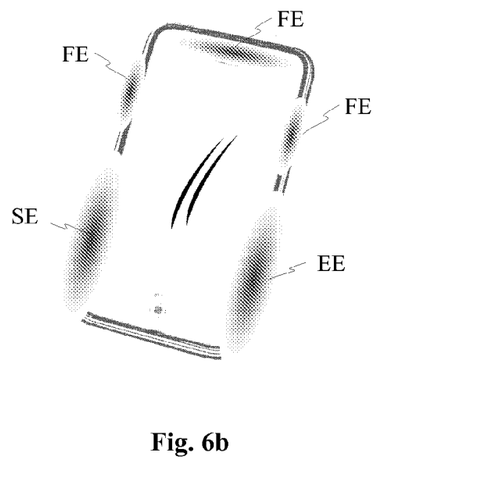

FIG. 6a and FIG. 6b show two more examples of the arrangement of the electrodes of a sensor device according to various embodiments. In FIG. 6a the transmitting electrode SE and the reception electrode EE are arranged in the lower area of the hand-held device. At both sides of the upper area of the hand-held device each time one field sensing electrode FE is arranged.

In this example the field sensing electrodes FE may be used as a replacement for conventional mechanical sensing device or switch. For example the field sensing electrodes FE or the detection signal assigned to the field sensing electrodes FE may be interlinked with a telephone book function of a mobile phone. If a user encompasses now the mobile phone with a hand and she/he approaches, for example with the thumb, the right or the left field sensing electrode FE, the mobile phone may be switched over automatically into a telephone book mode.

In combination with the application example, as it has been described in regard to FIG. 5, both field sensing electrodes FE may also be used as release while the camera mode is on. A suitable arrangement of the field sensing electrodes FE for this purpose is shown in regard to FIG. 6b.

In the case of the arrangement shown in FIG. 6b of the field sensing electrodes FE the electric signals S2 of the field sensing electrodes FE may also be used in order to further improve the detection precision for example to take a call on a mobile phone. This may be reached for example providing an electric signal by at least two field sensing electrodes FE, which exceeds each time a predetermined level.

The sensor device shown and described here may also be used in a hand-held device, for example a mobile phone, to switch it over from a first mode of operation into a second mode of operation. The first mode of operation may be for example a sleeping mode, the second mode of operation may be an active mode. In this way the energy consumption of a mobile phone may be clearly reduced because the mobile phone is only in an active mode when it is really encompassed by a hand is or it is in use.

In another usage scenario the sensor device according to various embodiments may also be arranged for example in a computer mouse. The electrodes of the first electrode structure may be arranged at the computer mouse in such a way that an encompassing of the computer mouse is detected. The field sensing electrodes of the second electrode structure may be provided for example to define the approaching areas for a left mouse button and for a right mouse button. If the computer mouse is not encompassed by a hand, the computer mouse may be switched over into a sleeping mode. Because of the necessary capacitive coupling of the transmitting electrode and the field sensing electrodes, it may also be avoided that a computer mouse is switched over into an active mode only by approaching one of the two field sensing electrodes, without also being encompassed at the same time by the hand.

In a further usage scenario a video camera (camcorder) may be equipped with the sensor device according to various embodiments. So for example in the area of the camera loop, in which the hand is introduced for the holding of the camera, the first electrode structure may be arranged. In this way it may be detected if the hand lies in the loop. In one embodiment of various embodiments a starting sequence of the camera or the camcorder may be started as soon as the hand lies in the loop. In this way the time lapse to starting a video recording may be considerably shortened. Moreover, the camera system may be configured in such a way that when the hand is removed from the loop, then for example, if the camcorder is stopped, at least the display of the camcorder is switched off.

In a further embodiment one or several field sensing electrodes FE may be arranged on the video camera, with which different actions on the video camera may be produced, when a finger approaches near enough to a corresponding field sensing electrode. Preferably, such actions are releasable by means of the field sensing electrodes on the video camera, which may be only produced when the hand lies in the loop of the video camera.

Figure 7:
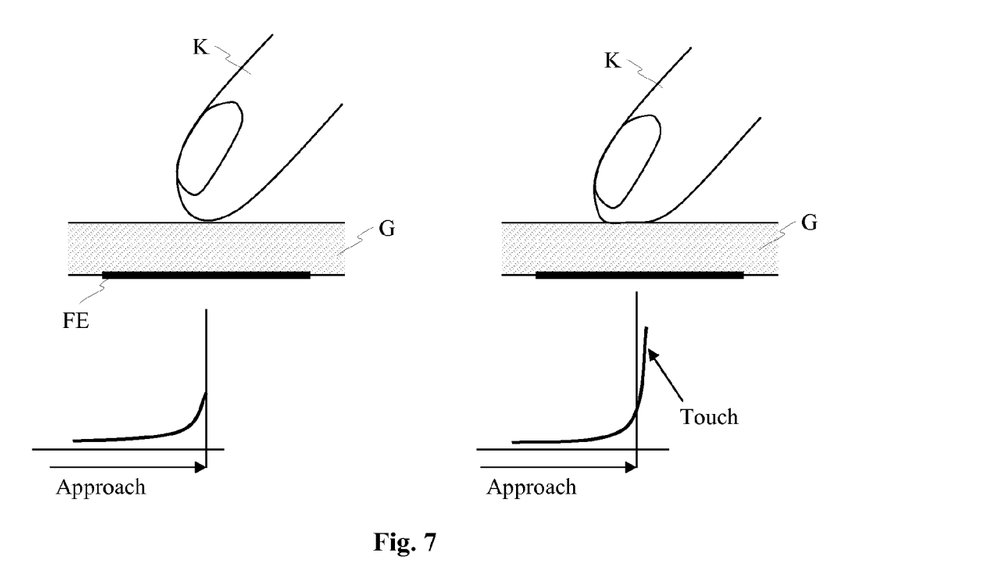
FIG. 7 two signal curves at a field sensing electrode one for one finger approaching to the field sensing electrode and one for one finger touching the surface of the field sensing electrode.

FIG. 7 shows a signal curve of the electric signal of a field sensing electrode FE in the case of an approach to, for example, a case of a hand-held device and by touching the shell. The field sensing electrode FE in this respect is not arranged on the outer side of the casing G, but on the inner side of the casing G. Thus the field sensing electrode is on the one hand protected from external influences and on the other hand the field sensing electrode has no influences on the design of the shell.

If a finger approaches the housing in the area in which a field sensing electrode FE is arranged, the level of the electric signal at the field sensing electrode FE increases constantly, as it is shown on the left side of FIG. 7. If the finger K touches the housing surface G, the coupling surface of the finger is rapidly enlarged, so that the capacitive coupling between the transmission electrode SE and the corresponding field electrode iron grows rapidly as well. This rapid growth of the capacitive coupling causes in turn that the electric current measured at the field sensing electrode FE grows rapidly as well. This rapid level rise of the signal measured at the field sensing electrode FE may be used in order to distinguish an approach to the field sensing electrode FE from touching the field electrode.

Figure 8:
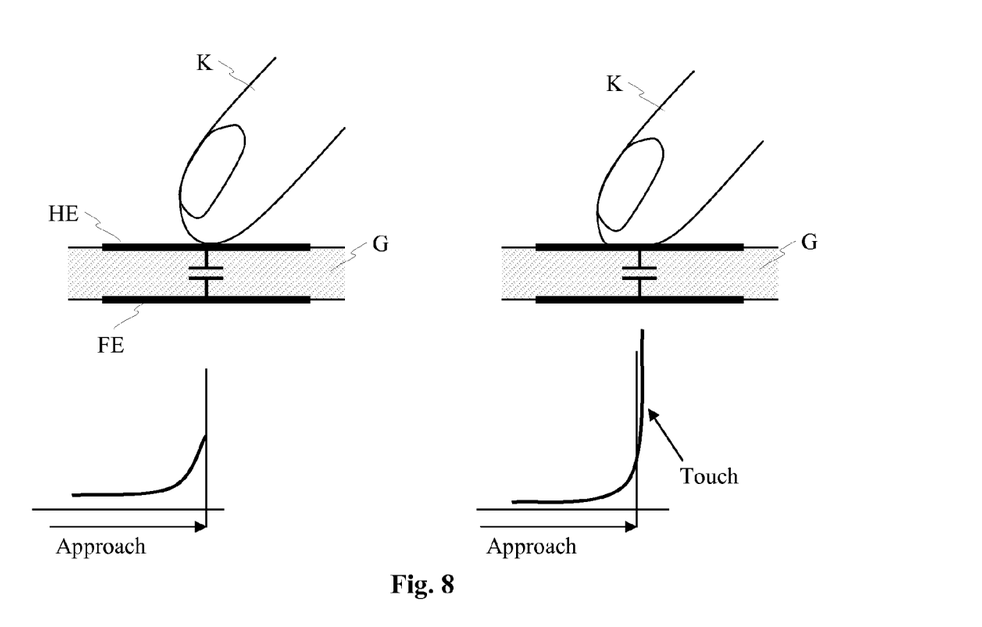
FIG. 8 the signal curves from FIG. 7, but in a field sensing electrode, which is assigned to an auxiliary electrode.

In order to bring a field sensing electrode FE arranged on the inner side of the housing G into a still better capacitive coupling to an approaching finger, an auxiliary electrode HE may be arranged on the shell outer surface or directly below the shell outer surface. Such an arrangement is shown in FIG. 8.

The auxiliary electrode HE is brought here in relation with the field sensing electrode FE arranged on the shell inner side. This may be done by means of a galvanic connection between the auxiliary electrode HE and the field sensing electrode FE. The galvanic connection has the advantage that the auxiliary electrode HE must not be arranged directly opposite the field sensing electrode FE. In another embodiment, the coupling of the auxiliary electrode HE with the field sensing electrode FE may also take place on a capacitive basis, as shown in FIG. 8. The capacitive coupling has the advantage that no openings must be provided on the shell G in order to couple the field sensing electrode FE with the auxiliary electrode HE.

By contrast with the signals or the signal curves shown in FIG. 7, the signal levels of the signals measured at the field sensing electrode FE are greater in case of an approaching finger, because the auxiliary electrode HE produces a better capacitive coupling between the field sensing electrode FE and the approaching finger. Likewise, touching the auxiliary electrode HE with a finger K has a stronger effect on the signal level of the signal measured at the field sensing electrode FE, because between the finger and the field sensing electrode FE no housing working as dielectric is present. Therefore, the rapidly increasing coupling surface of the finger leads to a still greater level rise of the signal measured at the field sensing electrode FE. Thus, a distinction between an approach and a contact may be made with still more precision.

The distinction between an approach and a contact may be provided in order to produce, for example in case of an approach to a field sensing electrode, a focusing of the camera (see FIG. 5) and, in case of a touch at the field sensing electrode, a picture-taking.

Figure 9:
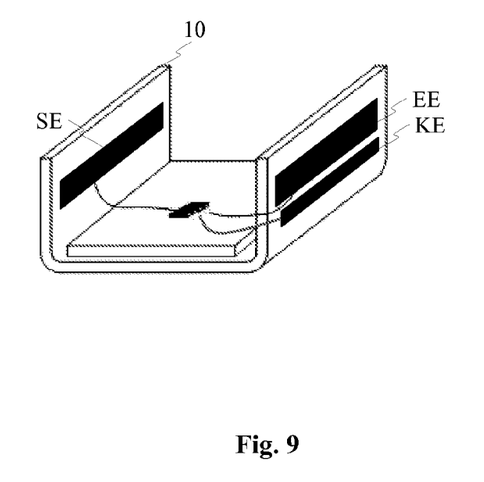
FIG. 9 the arrangement of the electrodes for a detection of an encompassing at a hand-held device.

In FIG. 9 the arrangement of the electrodes of the first electrode structure on a handheld device is symbolically shown. The transmitting electrode SE is arranged on the left side of the hand-held device. The compensation electrode KE and the reception electrode EE are arranged on the right side of the hand-held device, wherein the reception electrode EE is arranged over the compensation electrode KE.

In this way, it is possible to detect in a particularly advantageous way an encompassing of a hand-held device, whereas the detection of only an approach to the hand-held device is efficiently avoided.

In a further embodiment not shown here of the sensor device according to various embodiments, the first electrode structure may also have several transmitting electrodes, several compensation electrodes and/or several reception electrodes. Likewise, the sensor device may also include several first electrode structures, so that for example on a hand-held device, when several first electrode structures are arranged on a hand-held device, the encompassing of the hand-held device may be detected at different areas of the hand-held device.

Alternatively, it may also be detected if the hand-held device is encompassed or held by two hands.

The hand-held device may be for example a mobile phone, a computer mouse, a remote control, an input means for a game console, a portable minicomputer (PDA), a headphone, or the like. The sensor device according to various embodiments may also be provided for larger electrical appliances, in which it is for example necessary to detect a touch on the device and at the same time an approach to the device. The sensor device according to various embodiments may also be operated in such a way that the electric signals at the first electrode structure are evaluated independently of the electric signals measured at the second electrode structure.

What is claimed is:

1. A sensor device, comprising
at least one first sensor element for the detection of a touch and/or an approach, which is configured as a capacitive sensor element and which comprises a first electrode structure with a transmitting electrode arranged at a first side wall of a housing of the hand-held device and a reception electrode arranged at a second side wall of the housing opposing said first side wall, wherein a first alternating electrical field emitted by the transmitting electrode is coupleable into the reception electrode,
wherein the first electrode structure further comprises a compensation electrode arranged at the second side wall below the reception electrode;
at least one second sensor element, and
an evaluating device, which is coupled with the at least one first sensor element and with the at least one second sensor element, wherein the evaluating device comprises a signal generator for supplying the transmitting electrode with a first alternating electrical signal for generating the first alternating electrical field and for supplying the compensation electrode with a second alternating electrical signal for generating a second alternating electrical field, wherein the second alternating electrical field emitted by the compensation electrode is coupleable into the reception electrode, and wherein the evaluating device is configured to evaluate a first signal received from the reception electrode of the first sensor element and at least one second signal provided by the second sensor element and to generate at least one detection signal dependent on the evaluation.

2. The sensor device according to claim 1, wherein the second alternating electrical signal is dephased with respect to the first alternating electrical signal.

3. The sensor device according to claim 1, wherein the first sensor element comprises a second electrode structure, wherein the second electrode structure comprises a number of field sensing electrodes, wherein the reception electrode, the transmitting electrode, the compensation electrode and the field sensing electrodes are arranged with respect to one another in such a way that the first alternating electric field emitted by the transmitting electrode is also coupleable into at least one of the field sensing electrodes, and the capacitive coupling between the compensation electrode and the field sensing electrodes does not contribute with respect to the capacitive coupling of the compensation electrode and the reception electrode, wherein the evaluating device is configured to evaluate a third signal received from at least one of the field sensing electrodes.

4. The sensor device according to claim 3, wherein a change in a level of the at least one third signal received from the field sensing electrodes indicates that the object is approaching both the first electrode structure and the second electrode structure.

5. The sensor device according to claim 3, wherein at least one auxiliary electrode is assigned to one of the field sensing electrodes, wherein the auxiliary electrode is coupleable galvanically or capacitively with one of the field sensing electrodes.

6. The sensor device according to claim 3, wherein the third signal received from the field sensing electrodes are evaluated by a time-division multiplexing method.

7. The sensor device according to claim 1, wherein the amplitude of the first alternating electrical signal is greater than an amplitude of a second alternating electrical signal.

8. The sensor device according to claim 1, wherein a change in a level of the first signal received from the reception electrode is indicative for the approach of the object to the first electrode structure.

9. The sensor device according to claim 1, wherein the second sensor element comprises at least one of position sensor, acceleration sensor, photosensor, and temperature sensor.

10. The sensor device according to claim 1, wherein the sensor device is configured to be arranged in an electric hand-held device.

11. A method for providing a detection signal, comprising the steps:

receiving a first signal from a reception electrode of a first sensor element, wherein the first sensor element is configured as a capacitive sensor element and comprises a first electrode structure with a transmitting electrode arranged at a first side wall of a housing of the hand-held device and the reception electrode arranged at a second side wall of the housing opposing said first side wall, wherein the first electrode structure further comprises a compensation electrode arranged at the second side wall below the reception electrode and wherein the transmitting electrode is supplied with a first alternating electrical signal for generating a first alternating electrical field and the compensation electrode is supplied with a second alternating electrical signal for generating a second alternating electrical field, wherein the first and second alternating electrical field emitted by the transmitting electrode and the compensation electrode, respectively are coupled into the reception electrode, evaluating the first signal, evaluating a second signal, which is provided by a second sensor element, and generating a detection signal, which depends on the evaluated first signal and on the evaluated second signal.

12. The method according to claim 11, wherein the first sensor element comprises a second electrode structure, which comprises a number of field sensing electrodes, wherein the first alternating electric field emitted by the transmitting electrode is coupled into at least one field sensing electrode, a third signal is received from at least one field sensing electrode, and the third signal is evaluated, wherein the detection signal depends on the evaluated third signal.

13. The method according to claim 12, wherein the third signal is received from the at least one field sensing electrode in a time-division multiplexing method.

14. The method according to claim 12, wherein an auxiliary electrode is assigned to at least one of the field sensing electrodes, which is galvanically or capacitively coupleable with the field sensing electrodes.

15. The method according to claim 11, wherein the detection signal is indicative for the approach of a body to the first electrode structure and wherein in case of an approach of the body to the first electrode structure, which is arranged in an electric hand-held device, the electric hand-held device is switched from a first operating mode into a second operating mode.

16. The method according to claim 15, wherein the first operating mode is a sleeping mode and wherein the second operating mode is an active mode.

17. An electric hand-held device comprising a housing; and a sensor device comprising at least one first sensor element for the detection of a touch and/or an approach, which is configured as a capacitive sensor element and which comprises a first electrode structure, comprising a transmitting electrode arranged at a first side wall of the housing of the hand-held device and a reception electrode arranged at a second side wall of the housing opposing said first side wall, wherein a first alternating electrical field emitted by the transmitting electrode is coupleable into the reception electrode, wherein the first electrode structure further comprises a compensation electrode arranged at the second side wall below the reception electrode;

at least one second sensor element, and an evaluating device, which is coupled with the at least one first sensor element and with the at least one second sensor element, wherein the evaluating device comprises a signal generator for supplying the transmitting electrode with a first alternating electrical signal for generating the first alternating electrical field and for supplying the compensation electrode with a second alternating electrical signal for generating a second alternating electrical field, wherein the second alternating electrical field emitted by the compensation electrode is coupleable into the reception electrode, and wherein the evaluating device is configured to evaluate a first signal received from the reception electrode of the first sensor element and at least one second signal provided by the second sensor element and to generate at least one detection signal dependent on the evaluation.

18. The electric hand-held device according to claim 17, wherein the electrodes of the first electrode structure are arranged in a bottom area on a right and left side wall of the hand-held device in such a way that, in case of an encompassing of the hand-held device by a hand, these are at least partially covered by the hand.

19. The electric hand-held device according to claim 17, wherein the electric handheld device comprises at least one of mobile phone, input means for game console, mobile minicomputer, headphone, computer mouse, and remote control.

* * * * *